(12) United States Patent
Bohanan et al.

(10) Patent No.: US 7,569,951 B2
(45) Date of Patent: Aug. 4, 2009

(54) SYSTEMS AND METHODS FOR DRIVING A FERRITE LOAD

(75) Inventors: Scott James Bohanan, Duluth, GA (US); Jeffrey Malcolm Alexander, Atlanta, GA (US); LeAndra Elaine Evans, Atlanta, GA (US); David C. Rhodes, Marietta, GA (US)

(73) Assignee: EMS Technologies, Inc., Norcross, GA (US)

( * ) Notice: Subject to any disclaimer, the term of this patent is extended or adjusted under 35 U.S.C. 154(b) by 313 days.

(21) Appl. No.: 11/531,079

(22) Filed: Sep. 12, 2006

(65) Prior Publication Data

US 2008/0080215 A1    Apr. 3, 2008

(51) Int. Cl.
*H01F 27/42* (2006.01)
(52) U.S. Cl. ..................................... 307/412
(58) Field of Classification Search ................. 307/412
See application file for complete search history.

(56) References Cited

U.S. PATENT DOCUMENTS

| 3,988,686 | A | | 10/1976 | Beall et al. |
| 4,445,098 | A | * | 4/1984 | Sharon et al. ................. 333/1.1 |
| 5,089,716 | A | | 2/1992 | Wallis et al. |
| 5,278,574 | A | | 1/1994 | Zimmerman et al. |
| 5,302,959 | A | | 4/1994 | Harrington et al. |
| 7,409,162 | B2 | * | 8/2008 | Vig et al. ..................... 398/154 |

* cited by examiner

*Primary Examiner*—Robert L. Deberadinis
(74) *Attorney, Agent, or Firm*—King & Spalding

(57) ABSTRACT

A ferrite load driver system in accordance with the invention includes a clock generator configured to generate a digital clock signal. The system further includes a digital pulse generator configured to generate an enable pulse having a pulse width equal to a certain number of clock cycles of the digital clock signal. The enable pulse is received by a driver element of the system. The driver element responds by driving a current in a first direction through the ferrite load for setting a first magnetic flux.

18 Claims, 16 Drawing Sheets

SYSTEMS AND METHODS FOR DRIVING A FERRITE LOAD

DESCRIPTION OF THE RELATED ART

Driving a current of a certain amplitude for a certain duration of time through a ferrite load to effect a desired phase shift upon a radiated radio-frequency (RF) signal is known in the art. However, existing ferrite driver circuits suffer from various shortcomings that limit their performance. Some of these shortcomings will be described below using various figures.

FIG. 1A shows an exemplary prior art driver circuit 100 used to generate a variable width voltage pulse that is applied to a ferrite load. The variable width pulse, which is labeled Vout, is typically provided via line 130 to enable a field-effect transistor (FET) driver (not shown) configured to drive current of a selected amplitude in one of two opposing directions through the ferrite load. The duration of the current flow is determined by the pulse width of Vout.

Generation of Vout is initiated by an edge trigger applied to a clock input terminal of latch 135. In response to this edge trigger, Vout, which is at a logic-low level on start-up, transitions to a logic-high level. This transition is shown in the Vout vs. time graph 115 as corresponding to time t=0. Vout is coupled through an RC circuit, formed of a resistor 140 and a capacitor 145, to create a comparator voltage, Vcomp. The comparator voltage Vcomp is coupled to a negative polarity input terminal of a voltage comparator 155. The RC circuit transforms the relatively small rise time of Vout to a longer rise time that is shown in the Vcomp vs. time graph 110.

A reference voltage Vref, generated by a potential divider formed of a fixed resistor 120 and a variable resistor 125, is provided to the Vref terminal of voltage comparator 155. Variable resistor 125 may be adjusted to set Vref to a level $V_1$, which is shown in Vref vs. time graph 105. When comparator voltage Vcomp exceeds this threshold level $V_1$, voltage comparator 155 produces an output voltage, Vfdbk, that changes from a high voltage level to a low voltage level as shown in Vfdbk vs. time graph 151. The low voltage level is coupled via line 150 into the reset terminal of latch 135. The application of Vfdbk to the reset terminal of latch 135 causes Vout to drop to a logic-low level as designated by Vout at time $W_1$ of Vout vs. time graph 115.

On the other hand, if reference voltage Vref is set to a reference voltage level $V_2$ instead of reference voltage level $V_1$, voltage comparator 155 changes output voltage state at a later instant $W_2$ as can be understood from graphs 105, 110 and 115. In other words, changing the voltage level of Vref from voltage level $V_1$ to voltage level $V_2$ results in a change in pulse width of Vout from width $W_1$ to width $W_2$. Consequently, the pulse width of Vout can be varied merely be operating resistor 125 to set a desired Vref.

Unfortunately, driver circuit 100 suffers from several shortcomings that place undesirable limitations on its performance. A few of these shortcomings are described below.

The first shortcoming pertains to undesired operations arising from noise susceptibility of driver circuit 100. This shortcoming may be described using FIG. 1B, which shows a noise spike 114 generating an undesirable pulse width in Vout. $W_{desired}$ is the desired pulse width as shown in the Vout vs. time graph 115. However, referring to Vcomp vs. time graph 110 it will be observed that the amplitude of noise spike 114 causes waveform Vcomp to prematurely exceed voltage trigger threshold V1 at time $t_1$ rather than at time $t_2$. As a result of this, Vout has an undesirable pulse width corresponding to $W_{err}$ rather than $W_{desired}$.

A second shortcoming of driver circuit 100 may be described using a combination of FIGS. 1A and 1C. Referring to the Vtrg vs time graph 166, a first trigger pulse 167, which relates to edge trigger 160 of FIG. 1A, provides a rising edge at t=0. This rising edge results in Vout going to a high level as shown in Vout vs. time graph 115. Corresponding to this transition, Vcomp has a rising edge 111 with a slow rise time as shown in Vcomp vs. time graph 110. When rising edge 111 exceeds threshold trigger voltage $V_1$, voltage comparator 155 changes output voltage state thereby generating feedback pulse 152. Feedback pulse 152 resets latch 135 as described above, causing Vout to drop to a logic low level, which in turn causes Vcomp to have a falling edge 112 with a slow fall time.

For purposes of explaining the second shortcoming in driver circuit 100, it may be assumed that a second trigger pulse 168 with a rising edge at $t=t_3$ is provided to latch 135 after a re-trigger period $t_{trg}$ starting from t=0. Unfortunately, time $t_3$ occurs prior to falling edge 112 reaching zero level. Consequently, Vout transitions to a high level and Vcomp follows with a rising edge 113. Rising edge 113 exceeds the trigger threshold V1 at time $t_4$ thereby causing voltage comparator 155 to change output voltage state and generate feedback pulse 153. Feedback pulse 153 resets latch 135, which causes Vout to drop to a logic low level.

Referring to Vout vs. time graph 115 it can be observed that pulse width $W_4$ of the second pulse is undesirably less than pulse width W1 of the first pulse. This is because the re-trigger period $t_{trg}$ is smaller than a minimum re-trigger period that is necessitated for proper operation of driver circuit 100. It would be desirable to minimize this minimum re-trigger period so as to permit driver circuit 100 to be re-triggered faster without adversely affecting the pulse width of Vout.

A third shortcoming of driver circuit 100 may be described using a combination of FIGS. 1A and 1D. This shortcoming pertains to propagation delays in the various components of driver circuit 100. Referring to Vout vs. time graph 115 of FIG. 1D, Vout pulse 118 has a rising edge 116, which results in a rising edge 119 in Vcomp pulse 121. After a propagation delay ∇1 caused by the R-C time constant of resistor 140 and capacitor 145, rising edge 119 crosses trigger threshold voltage V1 thereby causing comparator 155 to change output state. This change in output state occurs after a propagation delay of ∇2 in comparator 155 and corresponds to falling edge 156 of the Vfdbk signal. The low level logic of Vfdbk that occurs after falling edge 156 has reached zero voltage, is coupled to the reset input of latch 135. After a propagation delay of ∇3 in latch 135, reset pulse 154 causes Vout to change state as indicated by falling edge 117 of Vout pulse 118.

As a result of these propagation delays, Vout pulse 118 is constrained to have a minimum pulse width PWmin equal to the sum of propagation delays ∇1, ∇2, and ∇3. Referring to FIG. 1D, this constraint leads to a dead zone in the Vcomp vs. time graph 110 during which time any input trigger Vtrg does not have an effect on Vout pulse 118. Vout pulse 118 remains at a logic high level until the Vfdbk signal resets latch 135.

Based on the above-mentioned shortcomings and other handicaps associated with of existing ferrite driver circuits, an unaddressed need exists in the industry to overcome such deficiencies and inadequacies.

SUMMARY

A ferrite load driver system in accordance with the invention includes a clock generator configured to generate a digital clock signal. The system further includes a digital pulse generator configured to generate an enable pulse having a pulse width equal to a certain number of clock cycles of the digital clock signal. The enable pulse is received by a driver element of the system. The driver element responds by driving a current in a first direction through the ferrite load for setting a first magnetic flux.

Clearly, some alternative embodiments may exhibit advantages and features in addition to, or in lieu of, those mentioned above. It is intended that all such alternative embodiments be included within the scope of the present invention, and be protected by the accompanying claims.

BRIEF DESCRIPTION OF THE DRAWINGS

Many aspects of the invention can be better understood with reference to the following drawings. The components in the drawings are not necessarily to scale. Instead, emphasis is placed upon clearly illustrating the principles of the invention. Moreover, in the drawings, like reference numerals designate corresponding parts throughout the several views.

DETAILED DESCRIPTION

The various embodiments in accordance with the invention generally describe a ferrite load driver system that can be used to drive a ferrite load in radio frequency (RF) phase shifting applications. The ferrite load driver system digitally generates a pulse having a pulse width equal to a selectable number of clock pulses. The pulse is used for driving a current through the ferrite load for setting a magnetic flux which determines the phase setting of the RF signal passing through the ferrite load. The digital nature of the pulse generation system provides several advantages over conventional pulse generation circuits that utilize analog circuitry to generate the ferrite load driving pulse. These aspects will be described below in further detail.

Figure 1A:
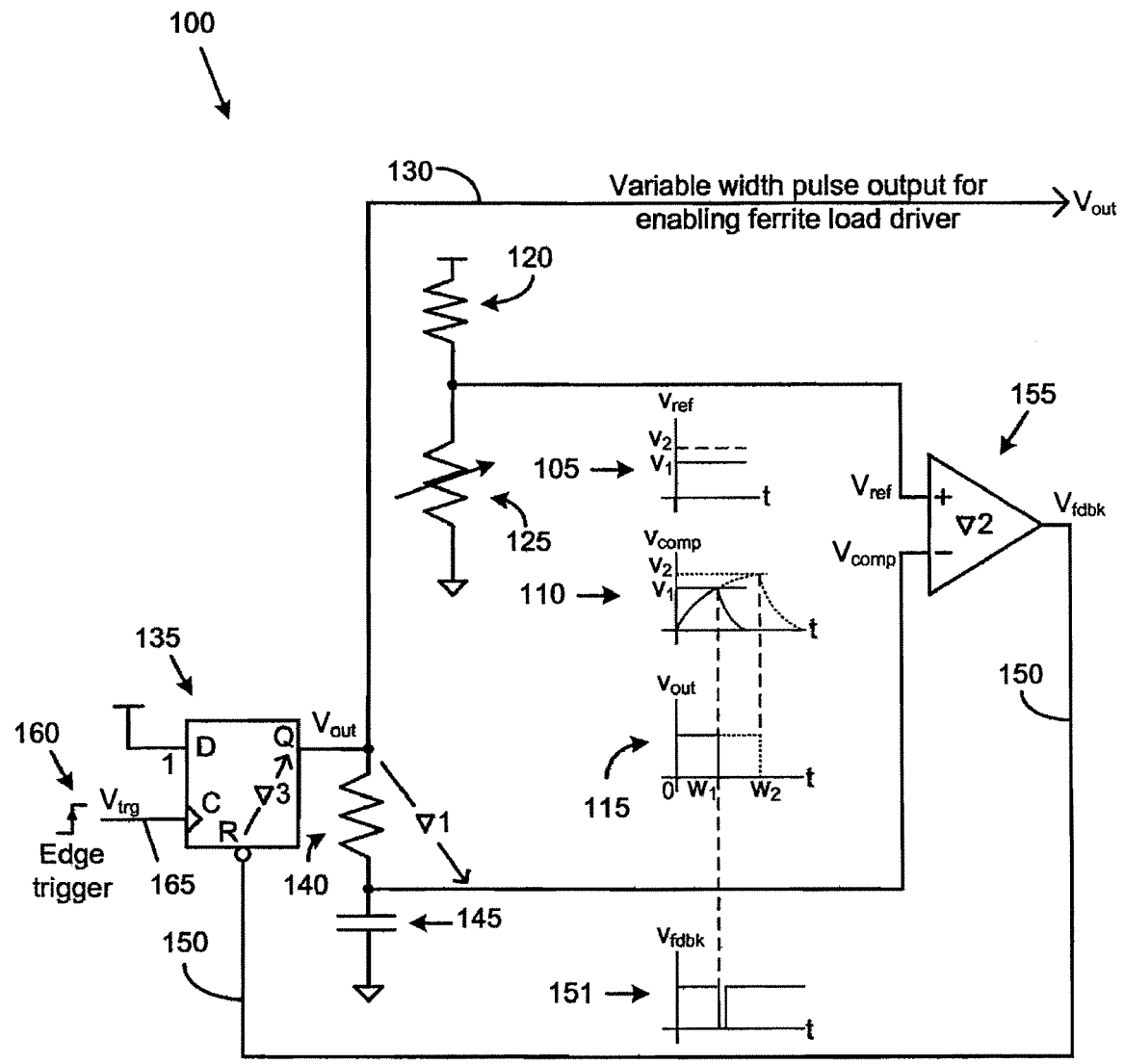
FIG. 1A shows a prior art ferrite load driver circuit.
Figure 1B:
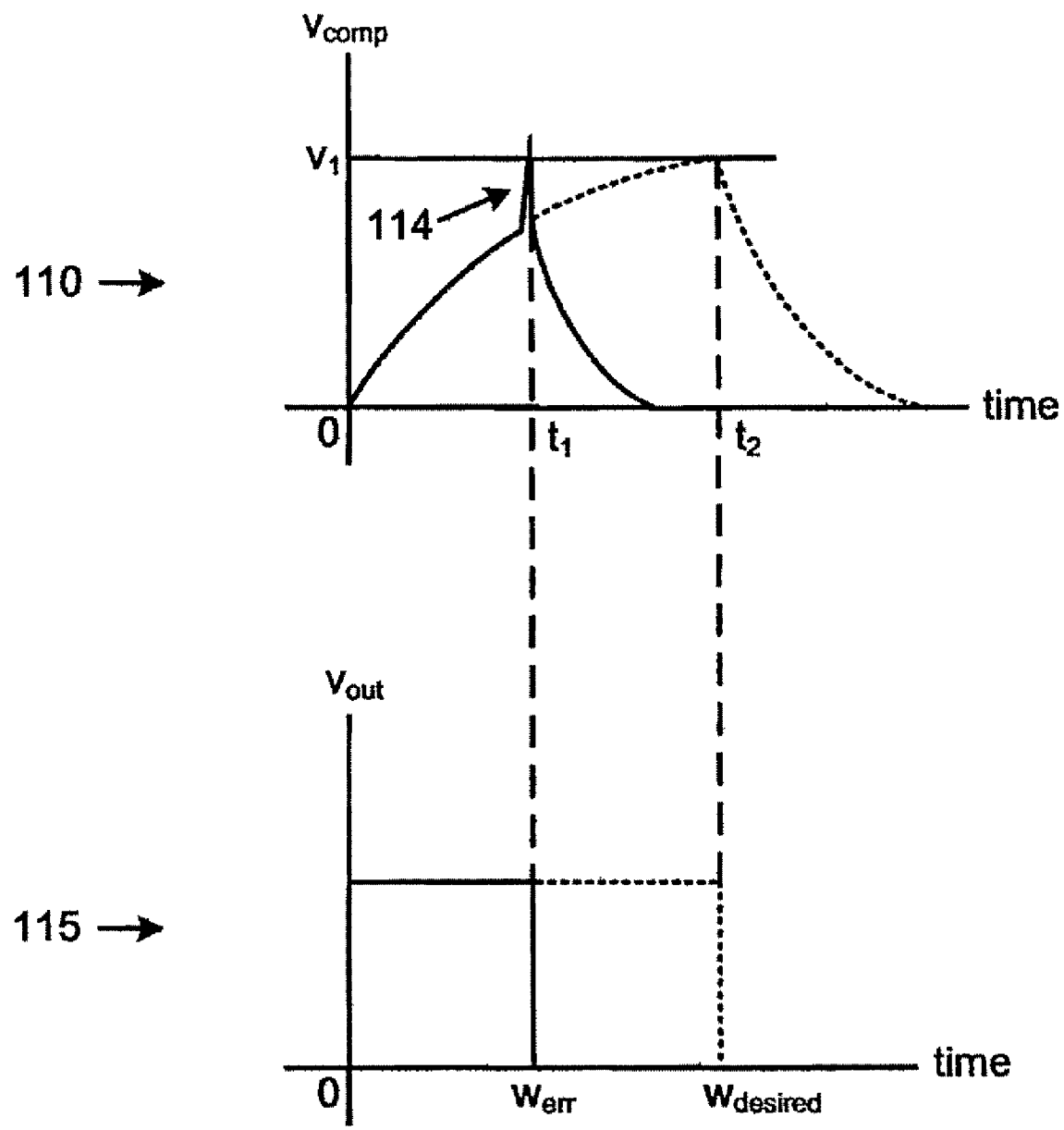
FIG. 1B shows a set of waveforms for describing a first shortcoming in the prior art ferrite load driver circuit.
Figure 1C:
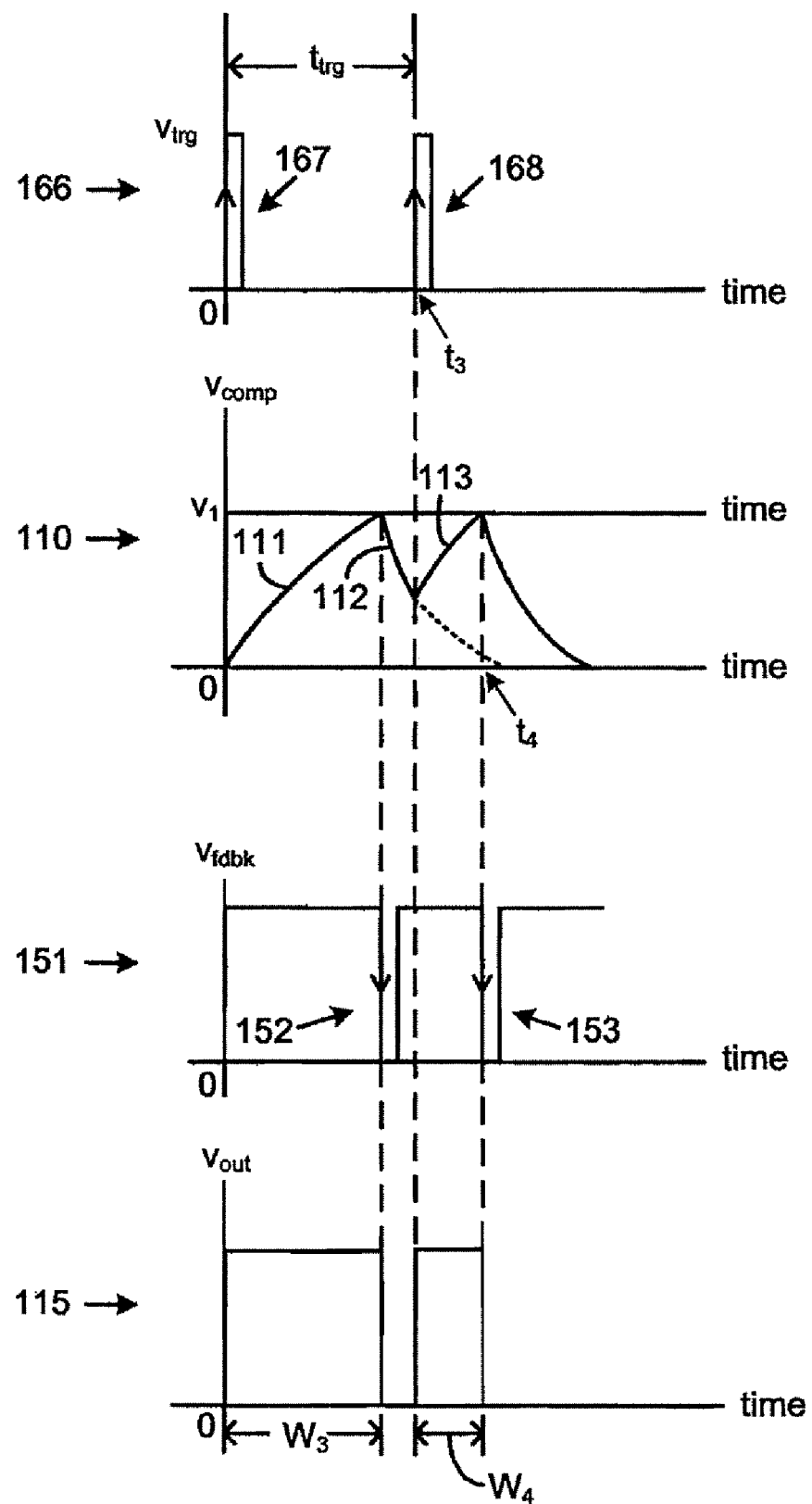
FIG. 1C shows another set of waveforms for describing a second shortcoming in the prior art ferrite load driver circuit.
Figure 1D:
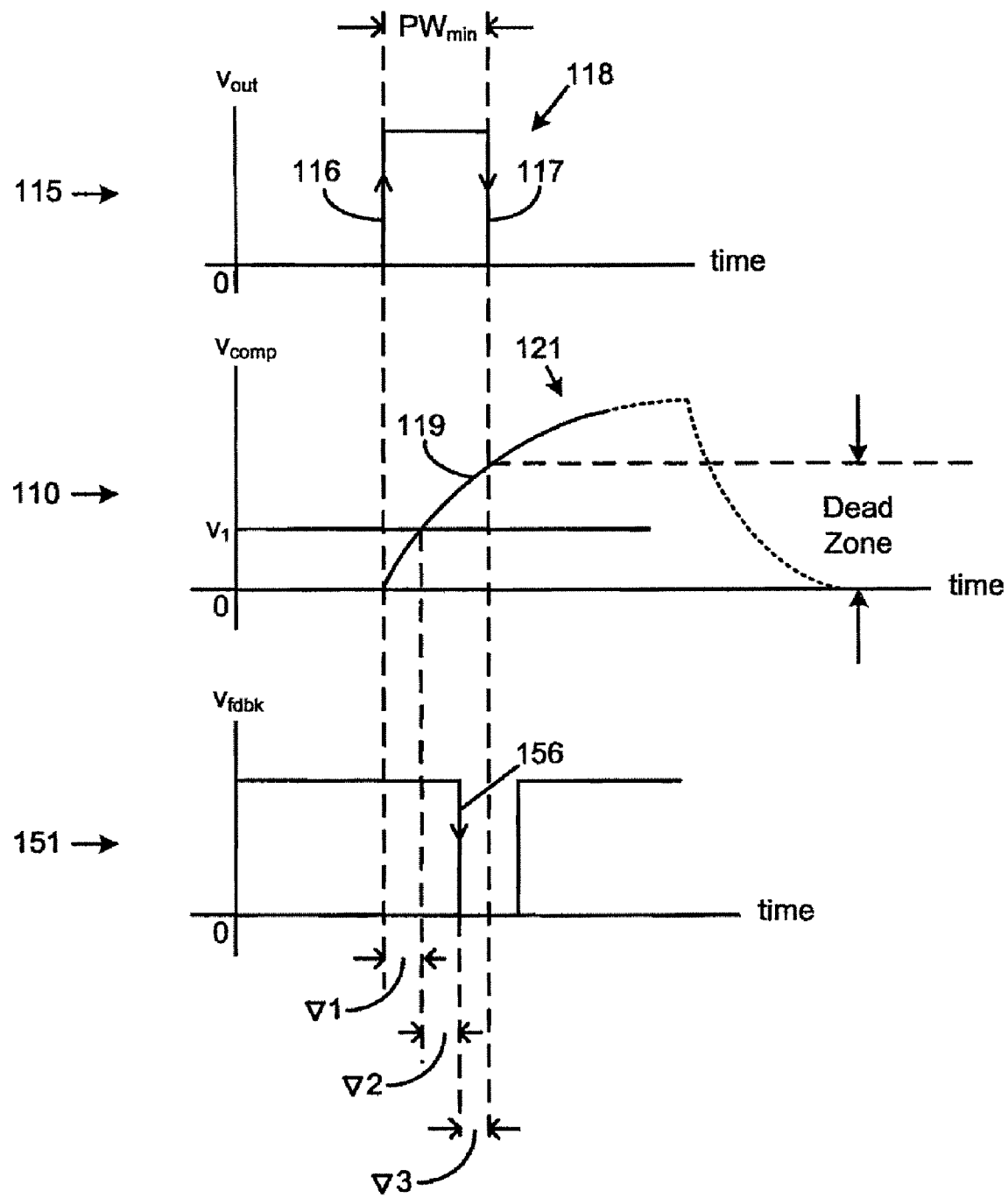
FIG. 1D shows yet another set of waveforms for describing a third shortcoming in the prior art ferrite load driver circuit.
Figure 2A:
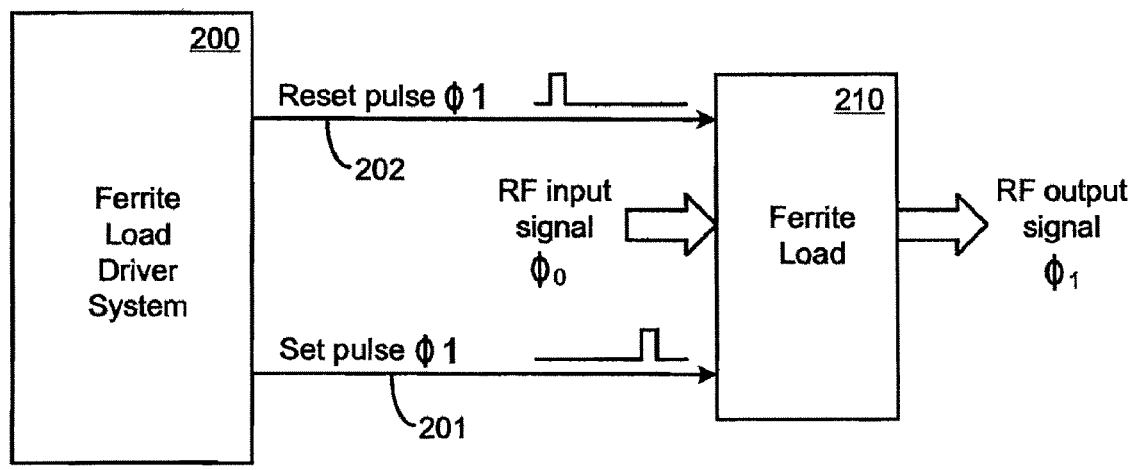
FIG. 2A shows a block diagram of a ferrite load driven by a ferrite load driver system in one exemplary embodiment in accordance with the invention.

FIG. 2A shows a block diagram of a ferrite load 210 being driven by a ferrite load driver system 200 in one exemplary embodiment in accordance with the invention. Typically, ferrite load 210 is a ferrite toroid with a coil winding. The toroid operates as a latch that can be set to various levels of magnetization by driving a current pulse of a certain magnitude and duration through the coil winding. This pulse, referred to as a Set pulse, is shown coupled into ferrite load 210 via an electrical link 201. The nature of the Set pulse determines the magnetic field generated in ferrite load 210 and the resulting magnetic flux is used for controlling the phase of an RF signal propagating through ferrite load 210. As shown in FIG. 2A, the RF input signal having a phase $\phi_0$ undergoes a phase shift after propagating through ferrite load 210 and is emitted as an RF output signal with a phase shift $\phi_1$.

The Set pulse is typically preceded by a Reset pulse driven by ferrite load driver system 200 through ferrite load 210 via an electrical link 202, for establishing a reference magnetization condition. The reference magnetization condition allows ferrite load driver system 200 to generate the Set pulse in a consistent manner. This aspect is explained further using FIG. 2B, which shows a flux change cycle in ferrite load 210 corresponding to a Reset pulse being driven through ferrite load 210 followed by a Set pulse.

Point 203 along the vertical axis (phase $\phi$) corresponds to a level of magnetization in ferrite load 210 due to a previous Set pulse. It is desired to change the level of magnetization to a new value necessary for example, to generate RF output signal with phase $\phi_1$. The procedure involved in carrying this out involves first driving a Reset pulse of an appropriate magnitude and duration through ferrite load 210. The Reset pulse causes the magnetization in ferrite load 210 to transition from point 203 to an intermediate flux state represented by point 204 before latching to the reference magnetization condition, which is a saturated level represented by point 205. The reference magnetization condition provides a known, initial state that is independent of any previous level of magnetization.

Once ferrite load 210 has a magnetization level corresponding to point 205, a Set pulse of suitable magnitude and duration is driven through ferrite load 210. The Set pulse causes the magnetization level to change from point 205 to the desired point 206, which, in this example, corresponds to a phase suitable for generating RF output signal with phase $\phi_1$.

In certain cases the Reset-Set sequence of operation described above is replaced with an alternative process that involves driving ferrite load 210 with a Superset pulse prior to driving it with a Reset pulse and a Set pulse. The Superset pulse is used to overcome certain shortcomings associated with a memory effect that may be present in some ferrite loads.

Figures 2B, 2C:
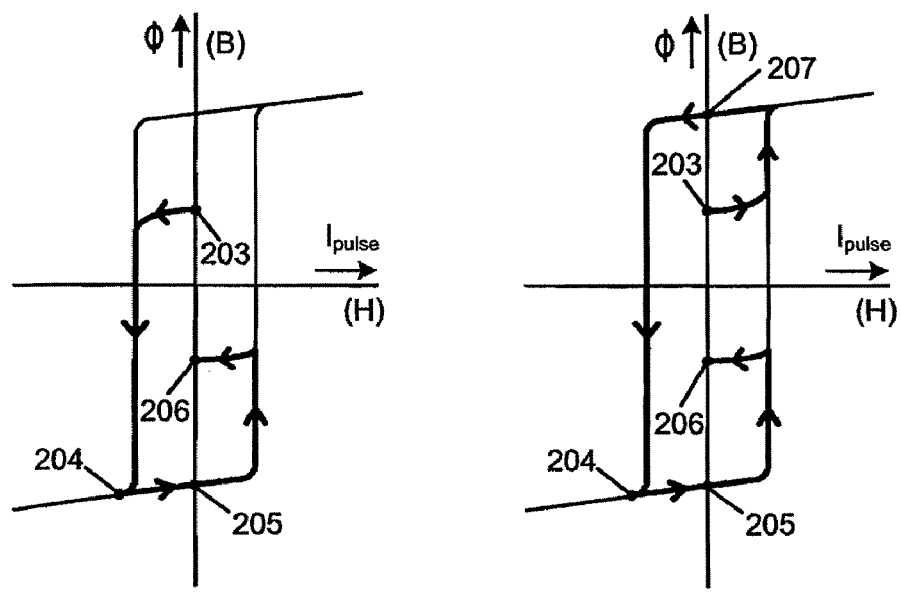
FIG. 2B shows a flux change cycle in the ferrite load of FIG. 2A corresponding to a Reset-Set sequence of operation.
FIG. 2C shows a flux change cycle in the ferrite load of FIG. 2A corresponding to a Superset-Reset-Set sequence of operations.

FIG. 2C shows a flux change cycle in ferrite load 210 corresponding to a Superset pulse being driven through ferrite load 210 followed by a Reset pulse and a Set pulse. In this procedure, a Superset pulse of a certain magnitude and duration is first used to change the magnetization level of ferrite load 210 from point 203 to a "Superset" magnetization level, which is a saturation level represented by point 207. The Superset pulse is followed by a Reset pulse, which causes ferrite load 210 to transition from point 207 to point 205 via point 204. A subsequently provided Set pulse then causes a transition from point 205 to point 206, which corresponds to the desired level of magnetization for generating RF output signal with phase $\phi_1$.

Figure 3:
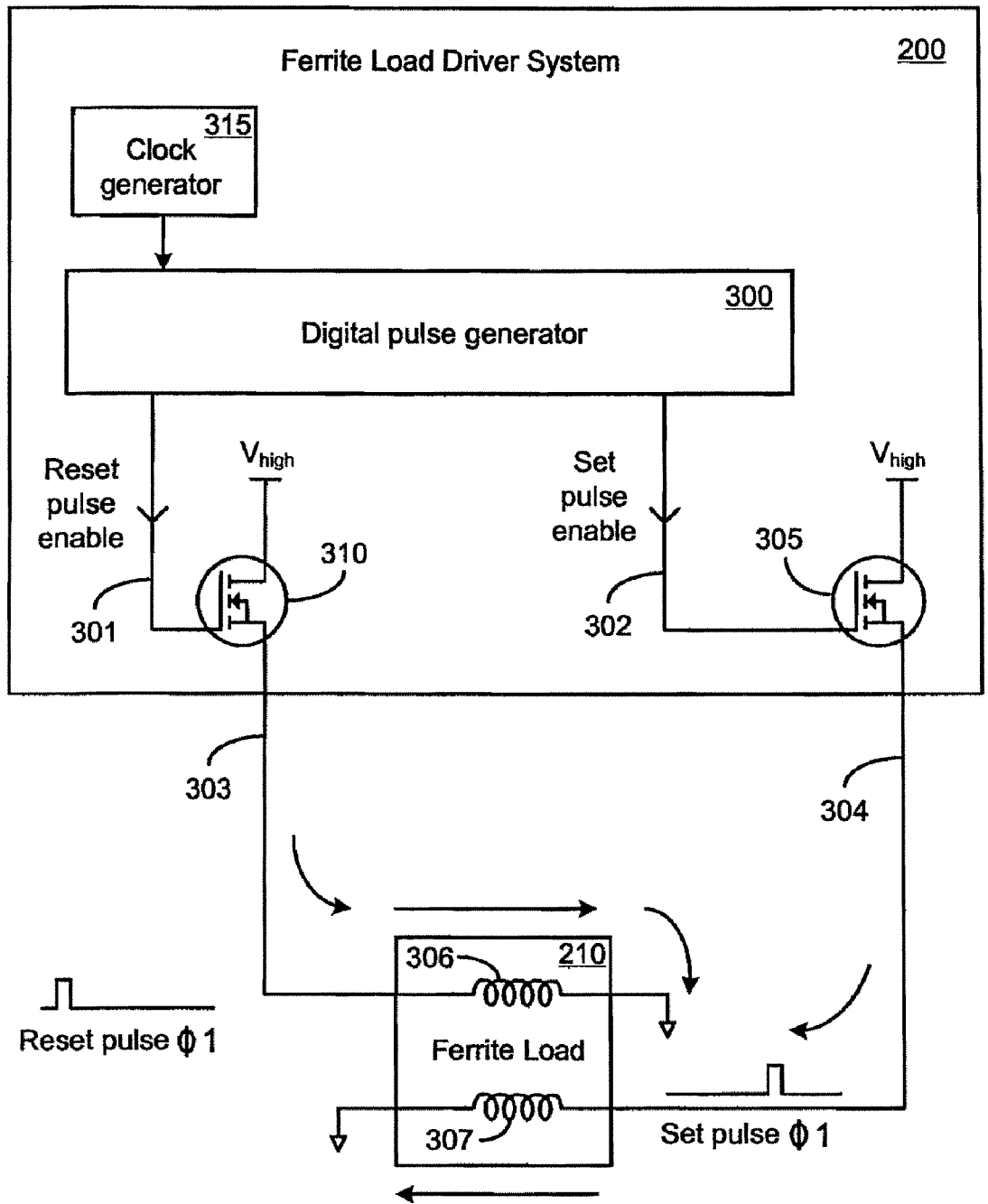
FIG. 3 shows a few components contained in the ferrite load driver system of FIG. 2A.

Attention is now drawn to FIG. 3, which shows a few components contained in ferrite load driver system 200. Specifically, ferrite load driver system 200 includes a digital pulse generator 300, which digitally generates a pair of pulse enable signals using a digital clock provided by clock generator 315. The pair of pulse enable signals is generated by digital pulse generator 300 in response to a request signal (not shown) that typically pertains to setting a desired phase upon the RF signal. Further details of digital pulse generator 300 are provided below using exemplary embodiments shown in FIGS. 5 and 6.

The first pulse enable signal is a Reset pulse enable signal that is coupled, via electrical link 301, to a control terminal of a driver element. In this exemplary embodiment, the driver element is a metal oxide semiconductor field effect transistor (MOSFET) 310 and the control terminal is a gate terminal of MOSFET 310. In other embodiments other driver elements may be used. Some non-exhaustive examples of driver elements include solid state devices such as a bi-junction transistor (BJT) and a silicon controlled rectifier (SCR).

The Reset pulse enable signal has an amplitude and a pulse width that is suited to drive MOSFET 310 for producing a Reset pulse on electrical link 303. The amplitude of the Reset pulse is determined by the supply voltage $V_{high}$ that is provided to MOSFET 310. Consequently, the amplitude of the Reset pulse may be tailored to suit the individual requirements of ferrite load 210. The Reset pulse results in a current flow in a first direction through a winding 306 of ferrite load 210.

The second pulse enable signal is a Set pulse enable signal that is coupled, via electrical link 302, to a control terminal of a second driver element. In this exemplary embodiment, the second driver element is MOSFET 305 and the control terminal is a gate terminal of MOSFET 305. The Set pulse enable signal drives MOSFET 305 to generate a Set pulse that may be tailored to suit the individual requirements of ferrite load 210. The Set pulse results in a current flow through winding 307 of ferrite load 210 in a second direction that is opposite to the first direction.

In one embodiment, windings 306 and 307 may be a commonly-shared winding that carries the currents related to the Reset and Set pulses. Suitable switching circuitry may be used to route the two current through the commonly-shared winding in opposite directions at different times. In an alternative embodiment, two independent windings are used. In yet another alternative embodiment, digital pulse generator 300 additionally generates a Superset pulse enable signal (not shown) that is coupled to a MOSFET for driving a Superset pulse through an individual or commonly-shared winding of ferrite load 210.

Figure 4:
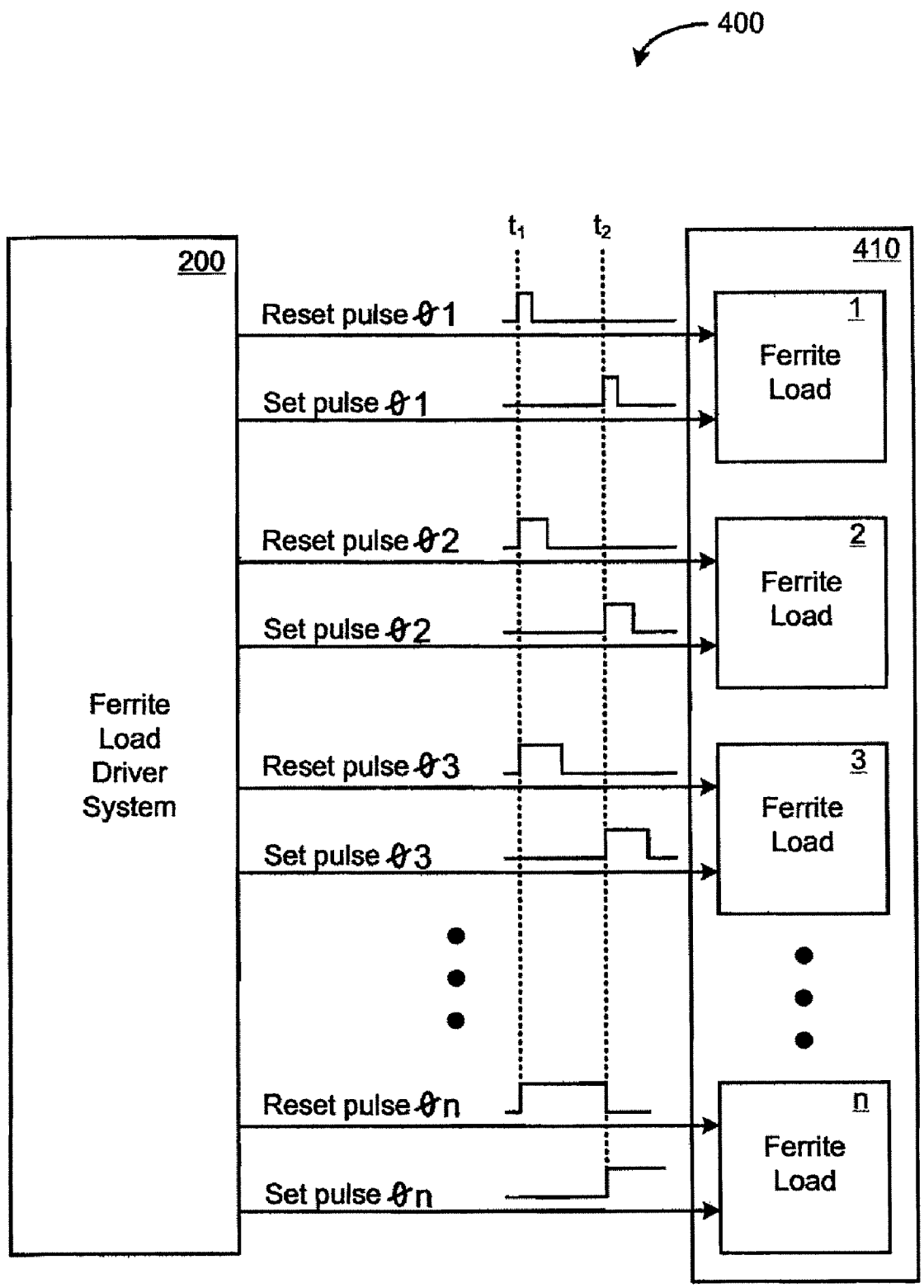
FIG. 4 shows a ferrite array load driven by the ferrite load driver system of FIG. 2A.

FIG. 4 shows an exemplary ferrite array 410 driven by ferrite load driver system 200. Ferrite array 410 contains several ferrite loads each of which may be similar to ferrite load 210 described above. Specifically, ferrite array 410 contains "n" ferrite loads. Ferrite load driver system 200 generates a first group of pulses that are used for driving ferrite load 1. The first group of pulses includes a Reset pulse, a Set pulse, and optionally, a Superset pulse. The amplitude and width of the each of the group of pulses driving ferrite load 1 are set to provide a phase shift value of $\phi_1$ to an RF signal (not shown) propagating through ferrite array 410. The Reset pulse is provided to ferrite array 410 at a time $t_1$, while the Set pulse is provided at a later instant $t_2$.

Ferrite load driver system 200 similarly generates a second group of pulses that are used for driving ferrite load 2. The second group of pulses also includes a Reset pulse, a Set pulse, and optionally, a Superset pulse. The amplitude and width of each of the group of pulses driving ferrite load 2 are set to provide a phase shift value of $\phi_2$ to the RF signal propagating through ferrite array 410.

Similar to the first and second group of pulses described above, ferrite load driver system 200 generates other groups of pulses, each of which is used to provide a desired phase shift value to the RF signal. In this manner, one or more RF signals propagating through ferrite array 410 results in an array of individual RF signals, each of which has a different phase shift. Such an array of RF signals is known in the art and will not be elaborated herein.

Attention is drawn to the group of pulses used to drive ferrite load "n." In this case, the falling edge of the Reset pulse is substantially coincident with the rising edge of the Set pulse. Ferrite load driver system 200 accommodates generation of pulses having such a timing relationship in contrast to conventional circuits that are unable to do so because of circuit constraints such as feedback circuit propagation delays.

Figure 5:
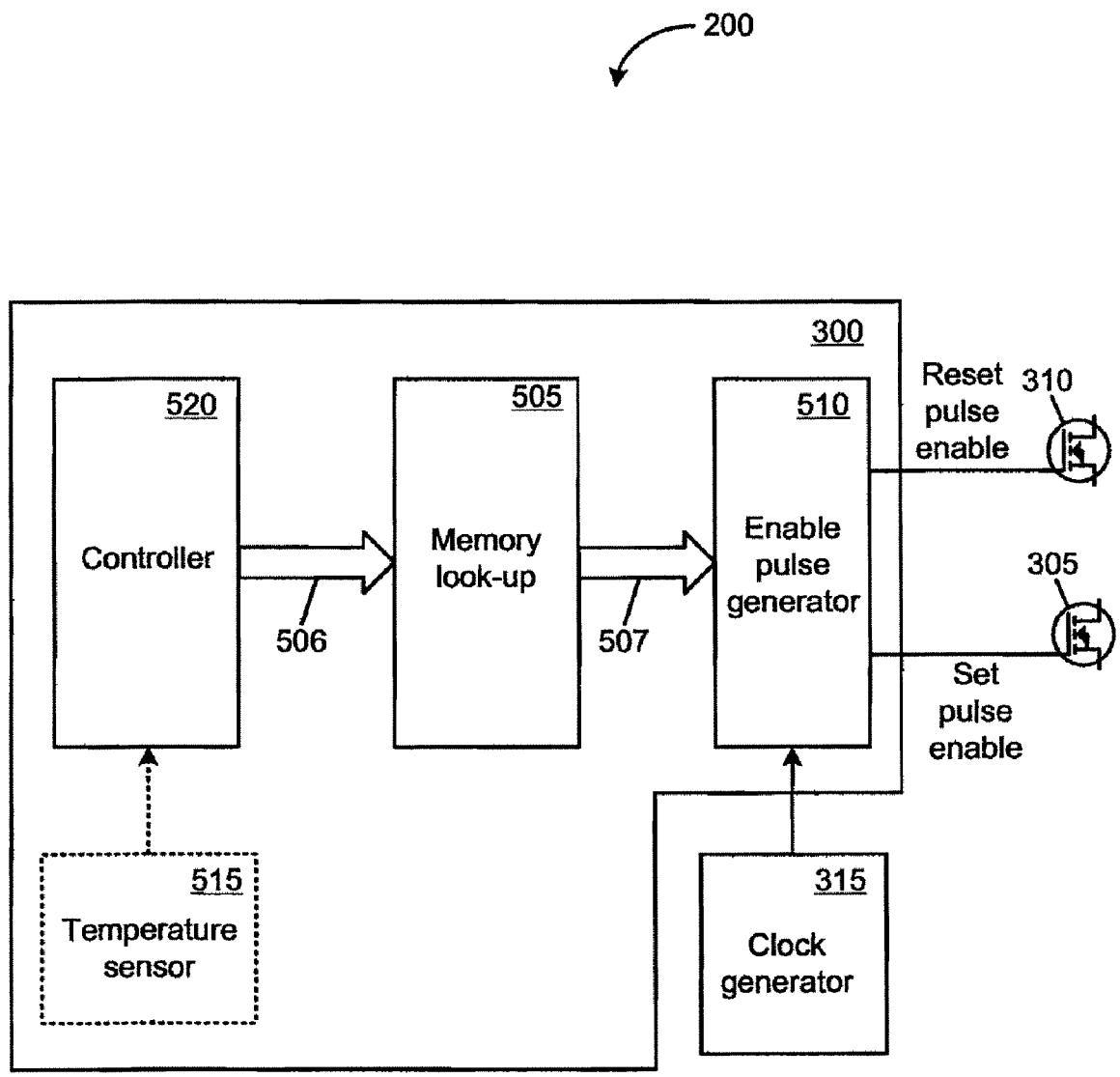
FIG. 5 shows an exemplary circuit embodiment for implementing the ferrite load driver system of FIG. 2A.

FIG. 5 shows an exemplary circuit embodiment for implementing ferrite load driver system 200 described above. Digital pulse generator 300 incorporates an enable pulse generator 510, which uses clock cycles provided by clock generator 315, to generate a Reset pulse enable, a Set pulse enable, and optionally, a Superset pulse enable signal (not shown). Each of these pulse enable signals has a pulse width corresponding to a number of clock cycles. Consequently, the minimum pulse width corresponds to a single clock cycle, with a higher clock frequency corresponding to a smaller pulse width.

Pulse width information, in the form of clock count values is provided to enable pulse generator 510 via data bus 507 from a memory look-up table 505. Memory look-up table 505 contains clock count values for a number of desirable pulse widths. Each of these clock count values are output on data bus 507 when memory look-up table 505 is provided a suitable address value by a controller 520 through an input address bus 506. The contents of memory look-up table 505 will be described below in more detail using FIGS. 11A and 11B.

In one exemplary implementation, enable pulse generator 510 has a counter circuit that is preset to an initial count by the clock count values provided by memory look-up table 505 via a data bus 507. The counter circuit is then triggered by a start pulse in a down-counting mode that results in a terminal count pulse. The start pulse and the terminal count pulse are logically combined to generate the Reset pulse enable. A similar circuit may be utilized to generate the Set pulse enable.

In certain implementations, some components, all components, or portions of components shown in FIG. 5 are implemented inside a programmable device such as a field programmable gate array (FPGA), a programmable logic device (PLD), or an application specific integrated circuit (ASIC). For example, enable pulse generator 510, look-up table 505, and clock generator 315, may be incorporated into an FPGA. Memory look-up table 505 may be alternatively implemented in a memory chip located external to the FPGA. The advantages of using programmable devices are known in the art and will not be elaborated herein.

As an optional feature, a temperature sensor 515 is coupled to controller 520, thereby permitting controller 520 to provide on data bus 507, clock count values that reflect various pulse widths for driving a ferrite load (not shown) under various operating temperatures.

Unlike conventional driver circuits where a feedback signal may be derived from the ferrite load or other components of a closed-loop, ferrite load driver system 200 operates is an open-loop system that does not require a feedback signal for generating driver signals such as the Reset pulse, Set pulse and Superset pulse. The advantages of an open-loop system include higher operating frequencies, elimination of adverse effects arising from certain propagation delays, and improved timing relationships between the various driver pulses. For example, the open-loop system of ferrite load driver system 200 allows generation of a pulse transition edge of one driver pulse substantially coincident with the pulse transition edge of another driver pulse. As a further example, when ferrite load driver system 200 is implemented inside a programmable device such as the FPGA, narrow driver pulses with improved timing relationship may be generated using clock frequencies in GHz frequency ranges. Conventional closed-loop circuits are handicapped in such applications.

Figure 6:
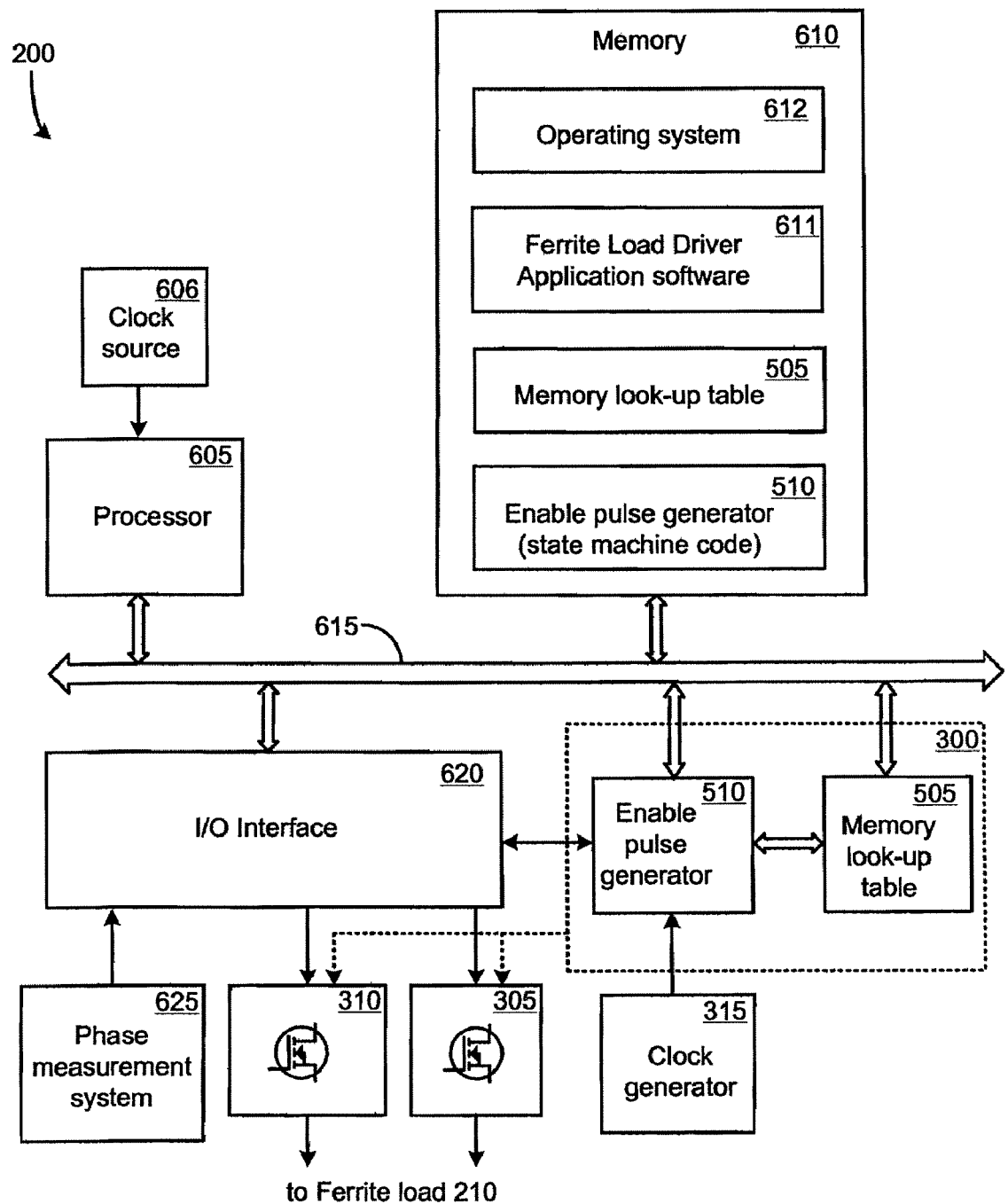
FIG. 6 shows another exemplary circuit embodiment for implementing the ferrite load driver system of FIG. 2A.

Attention is now drawn to FIG. 6, which shows a block diagram of another exemplary circuit embodiment for implementing ferrite load driver system 200 in accordance with the invention. Ferrite load driver system 200 can be implemented in software (e.g., firmware), hardware, or a combination thereof. In this exemplary embodiment, ferrite load driver system 200 is implemented in software as an executable program executed in an FPGA, a customized computer, or a general purpose computer.

Generally, in terms of hardware architecture as shown in FIG. 6, ferrite load driver system 200 includes a processor 605, memory 610, and one or more input and/or output (I/O) devices (or peripherals) that are communicatively coupled via a local interface 615. The local interface 615 can be, for example but not limited to, one or more buses or other wired or wireless connections, as is known in the art. The local interface 615 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 605 is a hardware device that uses a clock derived from a clock source 606 for executing software, particularly that stored in memory 610. The processor 605 can be any custom made or commercially available processor, a central processing unit (CPU), an auxiliary processor among several processors associated with a computer, a semiconductor based microprocessor (in the form of a microchip or chip set), a macroprocessor, or generally any device for executing software instructions. Examples of suitable commercially available microprocessors are as follows: an 80×86 or Pentium series microprocessor from Intel Corporation, a PowerPC microprocessor from IBM, a Sparc microprocessor from Sun Microsystems, Inc, or a 68xxx series microprocessor from Motorola Corporation.

The memory 610 can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory 610 may incorporate electronic, magnetic, optical, and/or other types of storage media. Note that the memory 610 can have a distributed architecture, where various components are situated remote from one another, but can be accessed by the processor 605.

The software in memory 610 may include one or more separate programs, each of which comprises an ordered listing of executable instructions for implementing logical functions. In the example of FIG. 6, the software in the memory 610 includes a ferrite load driver application software 611, an enable pulse generator 510 implemented in state machine code, a memory look-up table 505, and a suitable operating system (O/S) 612. The operating system 612 essentially controls the execution of other computer programs, such as the ferrite load driver application software 611 and the enable pulse generator 510, and further provides scheduling, input-output control, file and data management, memory management, and communication control and related services.

The ferrite load driver application software 611 may be written as a source program, executable program (object code), script, or any other entity comprising a set of instructions to be performed. When a source program, then the program needs to be translated via a compiler, assembler, interpreter, or the like, which may or may not be included within the memory 610, so as to operate properly in connection with the O/S 612. Furthermore, the ferrite load driver application software 611 can be written as (a) an object oriented programming language, which has classes of data and methods, or (b) a procedure programming language, which has routines, subroutines, and/or functions, for example but not limited to, C, C++, Pascal, Basic, Fortran, Cobol, Perl, Java, and Ada.

Memory 610 may further include a basic input output system (BIOS) (omitted for simplicity). The BIOS is a set of essential software routines that initialize and test hardware at startup, start the O/S 612, and support the transfer of data among the hardware devices. The BIOS is stored in ROM so that the BIOS can be executed when the computer is activated.

The I/O interface 620 provides communication interface with input devices, for example but not limited to, a keyboard and a mouse and also with output devices, for example but not limited to, a printer, display, etc. A phase measurement system 625 is communicatively coupled to I/O interface 620. Phase measurement system 625 is used to provide clock count information related to various phase values that may be settable upon a ferrite load. Obtaining the clock count information is described below using FIGS. 11A and 11B. In one configuration, MOSFETs 310 and 305 for driving ferrite load 210 (not shown) are also coupled to I/O interface 620.

In an alternative implementation, enable pulse generator 510 and memory look-up table 505, which are stored in memory 610, are replaced by equivalent components located external to memory 610. Digital pulse generator 300 is communicatively coupled to various components of ferrite load driver system 200 via local interface 615. In this exemplary implementation, digital pulse generator 300, which may be a part of an independent FPGA, contains memory look-up table 505 and enable pulse generator 510 that is provided a clock by clock generator 315. Digital pulse generator 300 is coupled to Reset pulse driver 510 and Set pulse driver 515. The operation of digital pulse generator 300 has been described above using FIG. 5. In this specific embodiment, clock generator 315 may be selected to provide a higher clock rate than that provided by clock 606 coupled to processor 605. A higher clock rate translates to a better capacity for generating Reset and Set pulses having smaller pulse widths with greater resolution.

When ferrite load driver system 200 is in operation, processor 605 is configured to execute software stored within the memory 610, to communicate data to and from the memory 610, and to generally control operations of ferrite load driver system 200 pursuant to the software. The ferrite load driver application software 611 and the O/S 612, in whole or in part, but typically the latter, are read by the processor 605, perhaps buffered within the processor 605, and then executed.

When ferrite load driver system 200 is implemented in the manner shown in FIG. 6, it should be noted that ferrite load driver application software 611 can be stored on any computer readable medium for use by or in connection with any computer related system or method. In the context of this document, a computer readable medium is an electronic, magnetic, optical, or other physical device or means that can contain or store a computer program for use by or in connection with a computer related system or method.

The ferrite load driver application software 611 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CD ROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where ferrite load driver system 200 is implemented, entirely or partially, in hardware, the order-picking system can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array (s) (PGA), an FPGA), etc.

Figure 7:
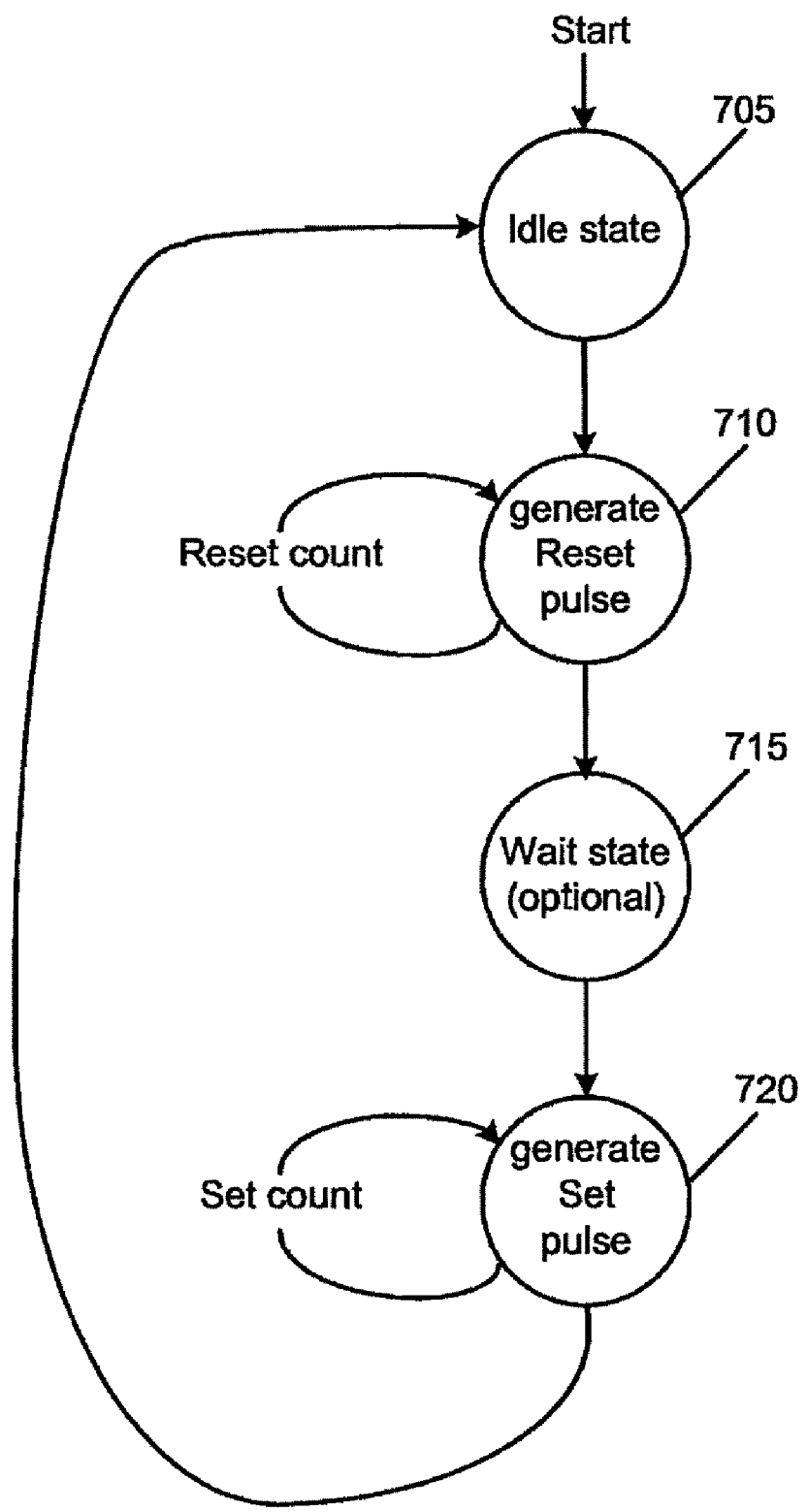
FIG. 7 shows a state diagram for a method of driving a ferrite load in accordance with the invention.

FIG. 7 shows a state machine diagram for a method of driving a ferrite load in accordance with the invention. Upon receipt of a Start command, the state machine on which the state diagram is implemented causes a state transition from idle state 705 to a state 710, where a Reset pulse is generated. In one exemplary implementation, the Reset pulse is generated after completion of a time period determined by the Reset count. The pulse width of the Reset pulse is proportional to the Reset count, with a larger pulse width corresponding to a larger Reset count.

After generation of the Reset pulse, the state machine transitions to an optional wait state 715 from where it transitions to state 720. In state 720 of the exemplary implementation, a desired Set pulse is generated after completion of a time period determined by the Set count. The pulse width of the Set pulse is proportional to the Set count, with a larger pulse width corresponding to a larger Set count. From state 720, the state machine transitions to idle state 705 where a further Start command is awaited.

In contrast to the exemplary implementation described above, in other exemplary implementations, the Reset and Set pulses are generated during the time periods determined by the Reset and Set counts respectively.

Figure 8:
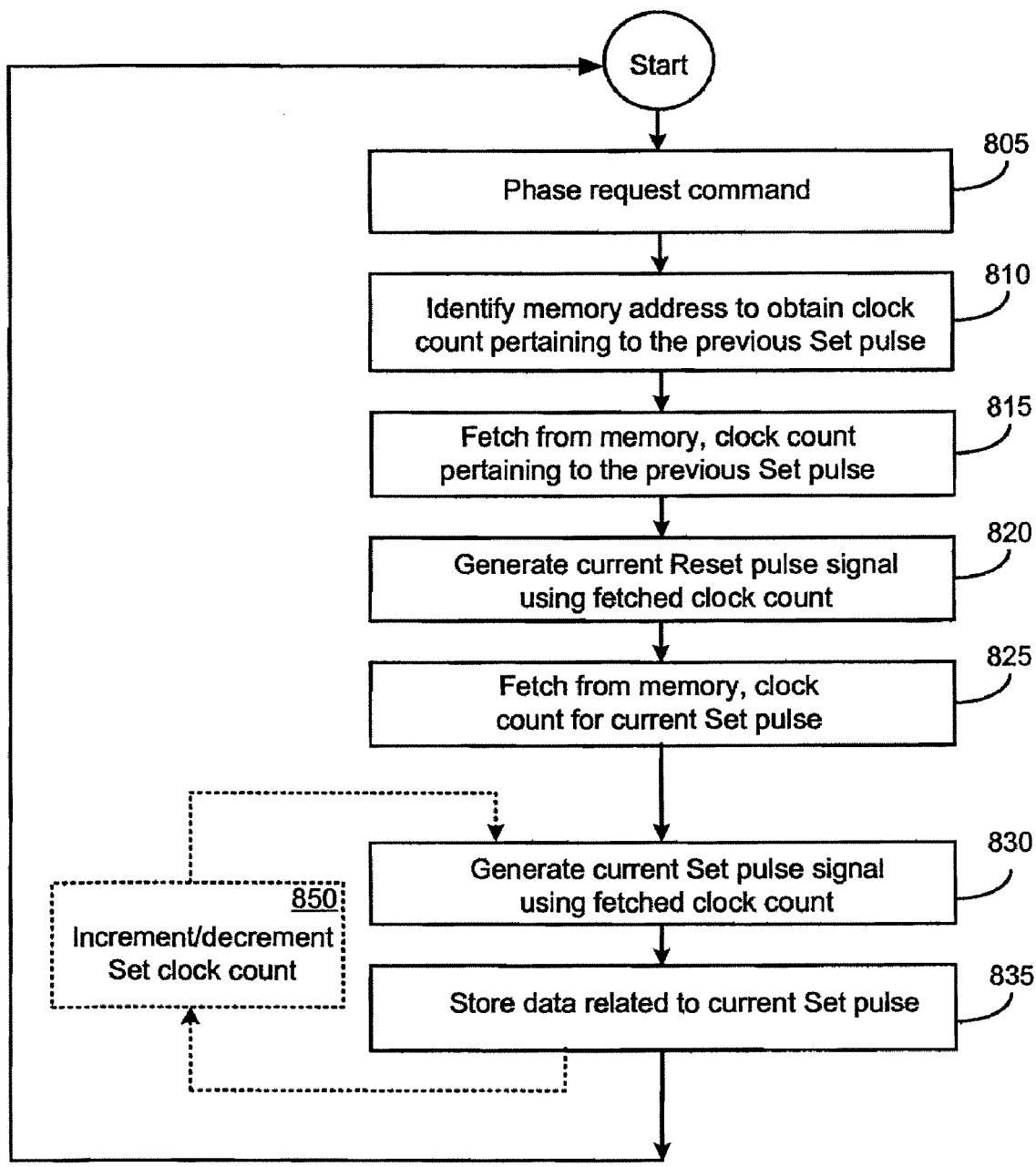
FIG. 8 shows a flowchart for generating Reset and Set pulses described in the state diagram of FIG. 7.

FIG. 8 shows a flowchart for generating Reset and Set pulses described in the state diagram of FIG. 7. It will be understood that the various blocks of FIG. 8 have been arranged in a particular sequence merely for purposes of description. In other embodiments, the various blocks may be implemented in alternative sequences, including, in some instances two or more blocks being implemented concurrently. Furthermore, in certain embodiments only a portion of the flowchart is implemented.

In block 805 a Start command is received. The Start command is typically associated with a request for setting a ferrite load to the appropriate magnetization state so as to impress a desired phase upon an RF signal propagating through the ferrite load.

In block 810, a memory address corresponding to a previous/last Set pulse signal is identified. The memory address points to a memory location containing a clock count corresponding to the previous Set pulse. This clock count, which is obtained in block 815, is necessary to identify the current magnetization state of the ferrite load from which the ferrite load has to be transitioned to the Reset state as was described above using FIG. 2B.

In block 820 a Reset pulse signal is generated using the clock count obtained in block 815. This clock count may be generated by combining the clock count with a fixed offset count, which consequently causes the magnetization level of the ferrite load to correspond to point 205 of FIG. 2B. This is followed in block 825 where the memory is again accessed to obtain a new clock count that satisfies the phase request command received in block 805. In block 830, the fetched clock count is used to generate the current Set pulse. Generation of the Set pulse is determined not only by the phase request command but may also be optionally determined by additional factors such as frequency of operation, temperature, operating voltage, switching speed, recovery time, aging, and altitude of operation. As one example, the Set pulse is set to a certain width for a first operating temperature and the width may be set differently for a different operating temperature. As another example, the Set pulse as well as the Reset pulse may be tailored to accommodate certain shortcomings in the material of the ferrite load. As yet another example, the Set pulse parameters such as amplitude and pulse shape may be selected to accommodate a certain type of driver element.

After generation of the Set pulse in block 830, data such as memory address and clock count is stored as shown in block 835. This data is used to generate the next Reset pulse when the flowchart of FIG. 8 is implemented recursively. The recursive operation is indicated by the loop back connection between block 835 and the Start block.

Attention is now drawn to block 850, which is an optional block used in certain implementations, wherein the magnetization level of the ferrite load may be changed in incremental and/or decremental steps. For example, the clock count associated with block 830 may be incremented in block 850 by a certain clock count and a new Set pulse generated in block 830. The dotted line loop shown encompassing blocks 830, 835 and 850 may be repeated recursively. In certain exemplary applications, blocks 830, 835 and 850 are implemented without implementing one or more blocks 805, 810, 815, 820 and 825.

Figure 9:
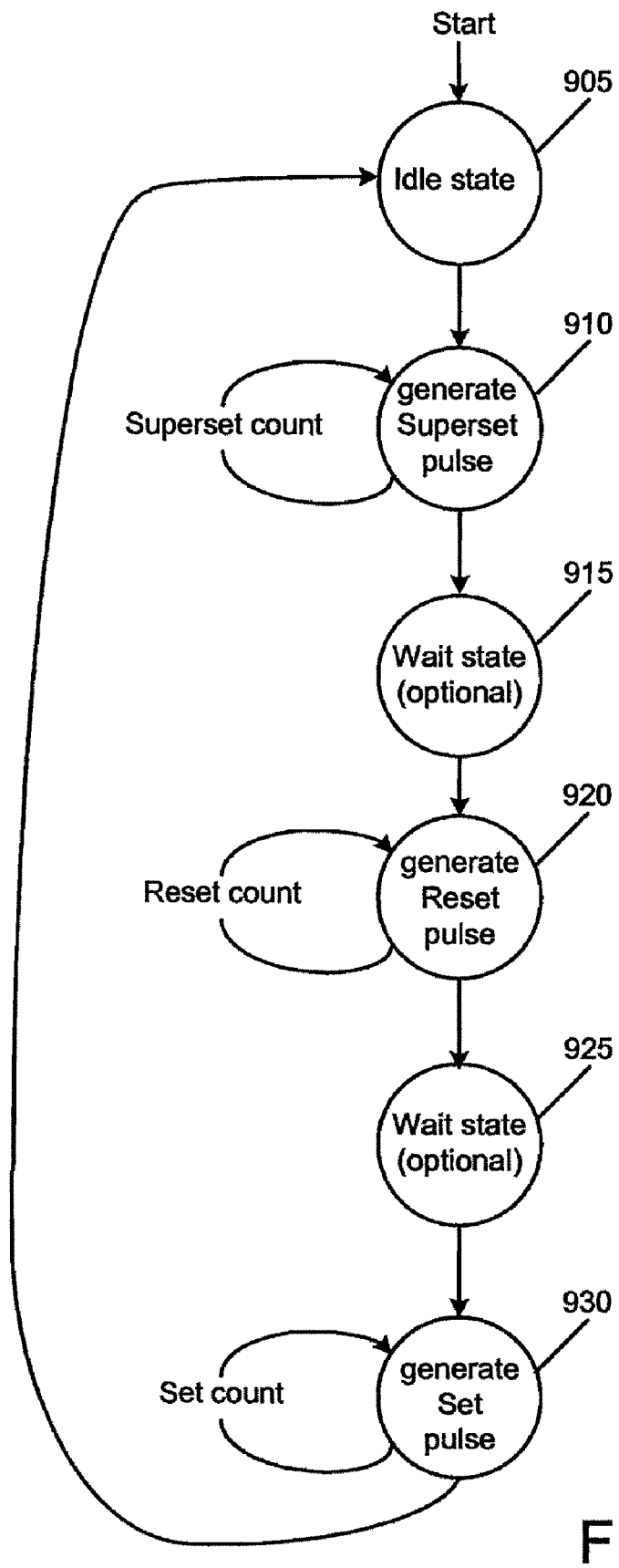
FIG. 9 shows a state diagram for an alternative method of driving a ferrite load in accordance with the invention.

FIG. 9 shows a state diagram for an alternative method of driving a ferrite load in accordance with the invention. In contrast to the method described using FIGS. 7 and 8 above, FIG. 9 incorporates a Superset pulse. The state machine of FIG. 9 implements the Superset-Reset-Set procedure described above using FIG. 2C.

Upon receipt of a Start command, the state machine on which the state diagram is implemented causes a state transition from idle state 905 to a state 910, where a Superset pulse is generated. In one exemplary implementation, the Superset pulse is generated after completion of a time period determined by the Superset count. The pulse width of the Superset pulse is proportional to the Superset count, with a larger pulse width corresponding to a larger Superset count. After generation of the Superset pulse in block 910, the state machine transitions to an optional wait state 915 from where it transitions to state 920.

In state 920 of the exemplary implementation, a Reset pulse is generated after completion of a time period determined by the Reset count. The pulse width of the Reset pulse is proportional to the Reset count, with a larger pulse width corresponding to a larger Reset count.

After generation of the Reset pulse, the state machine transitions to an optional wait state 925 from where it transitions to state 930. In state 930, a desired Set pulse is generated after completion of a time period determined by the Set count. The pulse width of the Set pulse is proportional to the Set count, with a larger pulse width corresponding to a larger Set count. From state 930, the state machine transitions to idle state 905 where a further Start command is awaited.

Figure 10:
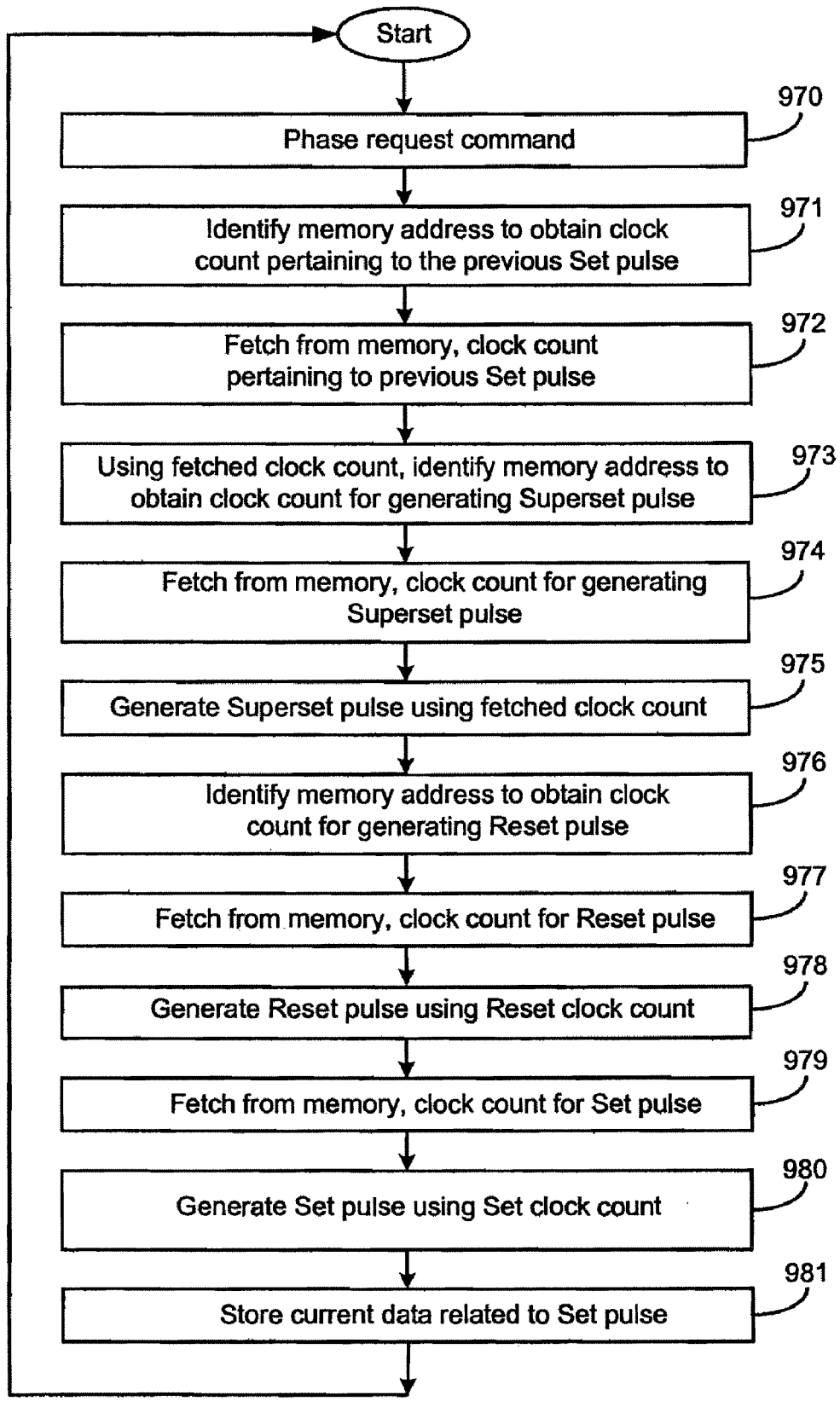
FIG. 10 shows a flowchart for generating Superset, Reset and Set pulses described in the state diagram of FIG. 9.

FIG. 10 shows a flowchart for generating Superset, Reset and Set pulses described in the state diagram of FIG. 9. It will be understood that the various blocks of FIG. 10 have been arranged in a particular sequence merely for purposes of description. In other embodiments, the various blocks may be implemented in alternative sequences, including, in some instances two or more blocks being implemented concurrently.

In block 970 a Start command is received. The Start command would typically request setting a ferrite load to the appropriate magnetization state so as to provide a desired phase upon an RF signal propagating through the ferrite load. In block 971, a memory address corresponding to a previous/last Set pulse signal is identified. The memory address points to a memory location containing a clock count corresponding to the previous Set pulse. This clock count, which is obtained in block 972, is indicative of the current magnetization state of the ferrite load from which the ferrite load has to be transitioned to the Superset state as was described above using FIG. 2C.

In block 973, the clock count fetched in block 972 is used for generating the Superset pulse. This may be carried out in part, by identifying a new memory location containing a clock count for generating the Superset pulse.

In block 974, the clock count corresponding to the Superset pulse is obtained from the new memory location. In block 975, a Superset pulse is generated using the clock count fetched in block 974.

Block 975 is followed by block 976 where a memory address is identified for obtaining a clock count for generating the Reset pulse. The Reset pulse is generated in block 978, after the clock count is fetched from memory ion block 977. After generation of the Reset pulse, a clock count for generation of the current Set pulse is fetched in block 979. The Set pulse is then generated in block 980 and in block 981, the data related to the current Set pulse is stored. The cycle depicted by the flowchart of FIG. 10 may then be repeated for other phase requests, as indicted by the loopback from block 981 to the Start block. It will be understood that in certain embodiments only a portion of the flowchart of FIG. 10 is implemented. Furthermore, these portions may be implemented in a recursive manner.

Figure 11A:
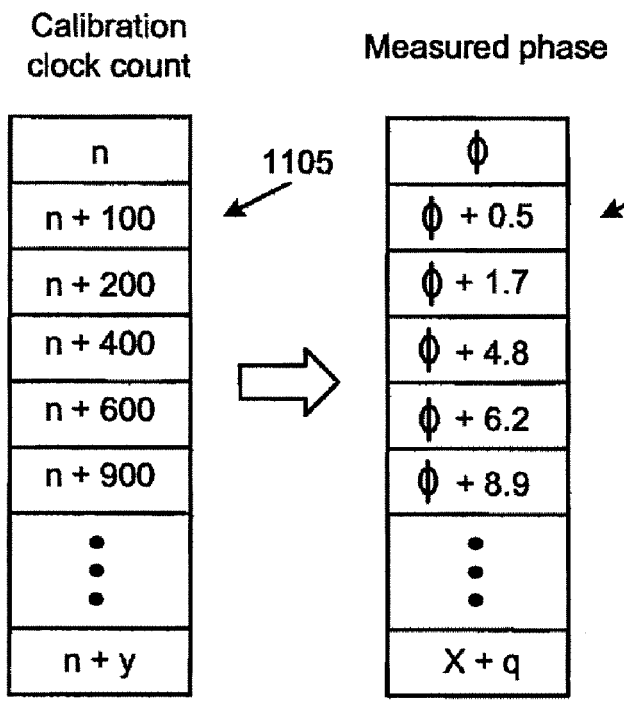
FIGS. 11A and 11B show exemplary tabulations to describe a method of calibrating a ferrite load driver system in accordance with the invention.
Figure 11B:
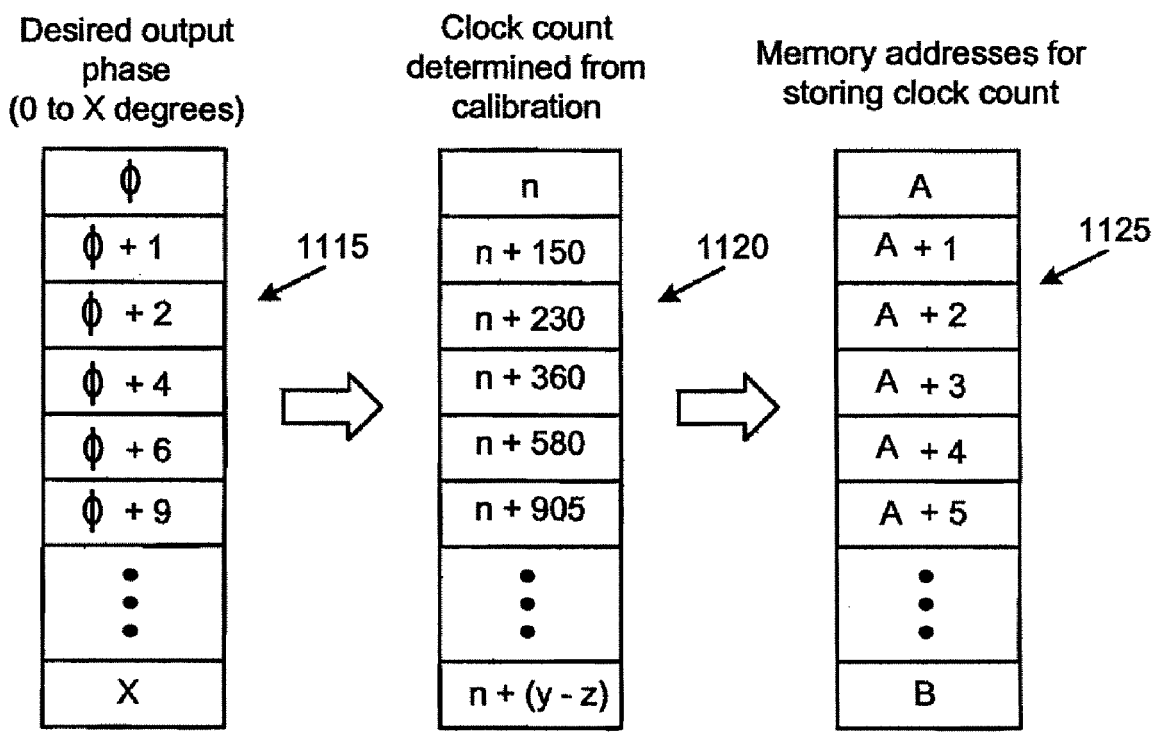

FIGS. 11A and 11B show exemplary tabulations to describe a method of calibrating a ferrite load driver system in accordance with the invention. Specifically, FIG. 11A shows two tabular columns—tabular columns 1105 and 1110. For purposes of description, the calibration method will be performed using the exemplary ferrite load driver system 200 of FIG. 5.

Tabular column 1105 contains several clock counts arbitrarily selected for obtaining corresponding phase measurements in a data collection procedure. While tabular column 1105 shows these count values as incremental, integer values, in alternative embodiments, the clock count values may be selected using other criteria such as a decreasing count with a value other than 100.

Tabular column 1105 is incorporated into memory look-up table 505, with each of the count values stored in sequential memory locations. Controller 520 provides a sequential addressing sequence so that each of the count values is sequentially output on data bus 507. Enable pulse generator 510 responds by generating a Reset pulse whose pulse width is determined by the clock count stored in the previous address, followed by generating a Set pulse whose width is determined by the clock count stored in the current address. The Reset and Set pulses drive the ferrite load. A phase measurement device (not shown) is coupled to the RF signal to carry out phase measurements. The measured phase values for each of the Set pulses are tabulated as shown in tabular column 1110. Tabular column 1110 may be implemented in paper form where a human operator writes down each of the phase measurements. Alternatively, tabular column 1110 may be generated automatically using an automated test-set up such as one using phase measurement system 625 of FIG. 6.

Attention is now drawn to tabular column 1115 of FIG. 11B. Tabular column 1105 contains several phase angle values ranging from 0 degrees to X degrees, where, for example, X=90°, 180°, and 360° in some applications and X>360° in others. While tabular column 1115 shows these phase angle as incremental, integer values, in alternative embodiments, the phase angles may be selected using other criteria such as a decreasing count with a value other than 1 or a fractional value.

Using the measured phase values obtained from tabular column 1110, a set of clock count values that correspond to each of the phase angles of tabular column 1115 is calculated. The calculation may be performed manually or automatically. The calculation process may be briefly described using an exemplary phase angle value of ($\phi$+4). Tabular columns 1105 and 1110 indicate that a clock count of (n+200) produced a phase angle value of ($\phi$+1.7) while a clock count of (n+400) produced a phase angle value of ($\phi$+4.8). An interpolation calculation between these two measurements provides a clock count value of (n+360) corresponding to the phase angle value of ($\phi$+4). The interpolation calculation has been provided here merely for purposes of explanation, and may be carried out either manually or via a computer, using various techniques such as curve-fitting, numerical calculations, and statistical calculations.

Upon completion of tabular column 1120, the clock count values are stored in a look-up table, such as memory look-up table 505, for subsequent use by ferrite load driver system 200. Tabular column 1125 represents the addressing information for accessing the clock count values of tabular column 1120 stored in memory look-up table 505. In this example, sequential addresses are used. In other embodiments, non-sequential addresses may be used.

The calibration method may be repeated over a period of time and/or under a variety of environmental conditions such as temperature and humidity so that the ferrite load driver system may be operated effectively under these various conditions. Temperature sensor 515 of FIG. 5 coupled to controller 520 allows controller to determine the appropriate count values to be stored and/or used for various operating temperatures.

In addition to determining clock count values for Set signals, the calibration process described above may be further used to determine clock count values in tabular column 1120 for generating Superset signals.

Figure 12:
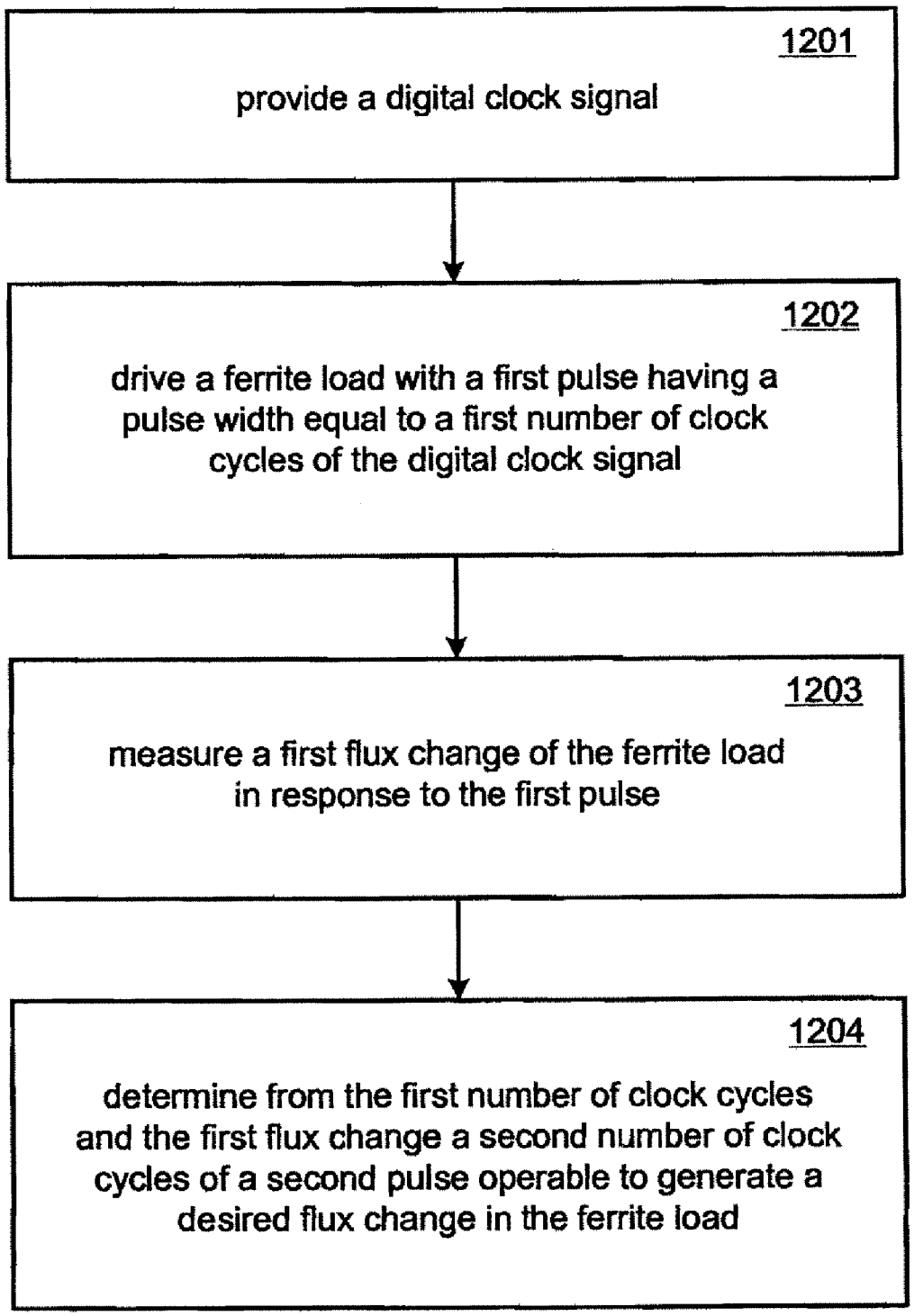
FIG. 12 shows a flowchart of a method of calibrating a ferrite load driver system in accordance with the invention.

FIG. 12 shows a flowchart of a method of calibrating a ferrite load driver in accordance with the invention. In block 1201, a digital clock signal is provided. In block 1202, the ferrite load is driven with a first pulse having a pulse width equal to a first number of clock cycles of the digital clock signal. In block 1203, a resulting flux change is measured. The flux change may be measured in the form of a phase angle measurement of an RF signal propagating through the ferrite load. In block 1204, the first number of clock cycles and the flux change measurement is used to calculate a second number of clock cycles that can be used to generate a desired flux change in the ferrite load.

Figure 13:
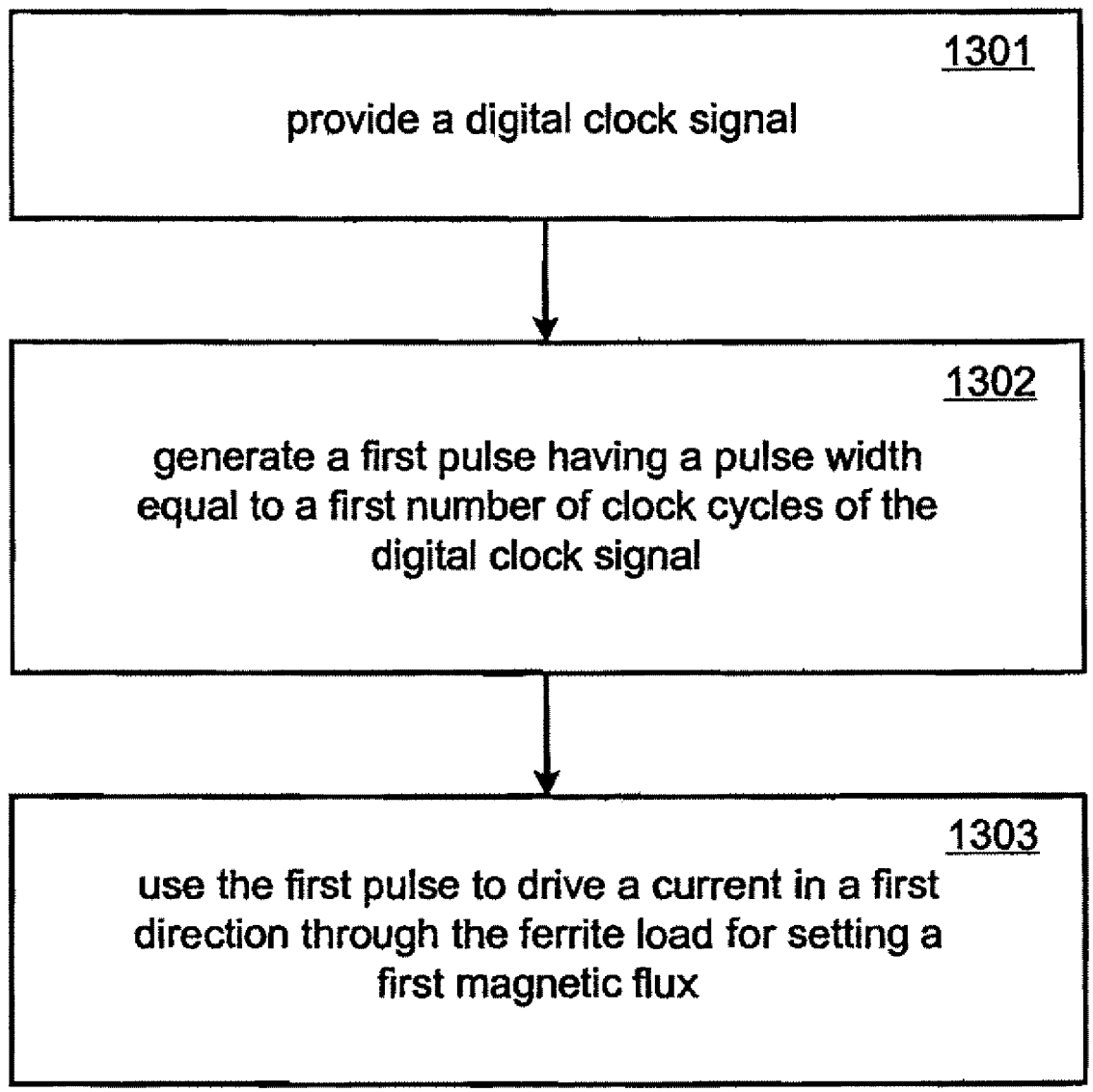
FIG. 13 shows a flowchart of a method of driving a ferrite load in accordance with the invention.

FIG. 13 shows a flowchart of a method of driving a ferrite load in accordance with the invention. In block 1301, a digital clock signal is provided. In block 1302, a first number of clock cycles of the clock generator is used to generate a first pulse. In block 1303, the first pulse is used to drive a current through the ferrite load in a first direction for setting a first magnetic flux.

The above-described embodiments are merely set forth for a clear understanding of the principles of the disclosure. Furthermore, various terms are used as a matter of convenience and persons of ordinary skill in the art will recognize the context in which these terms are used. Many variations and modifications may be made without departing substantially from the disclosure. All such modifications and variations are included herein within the scope of this disclosure.

We claim:

1. A ferrite load driver system, comprising:
   a clock generator operative to generate a digital clock signal;
   a digital pulse generator operative to generate a first enable pulse having a pulse width substantially equal to a first number of clock pulses of the digital clock signal and a second enable pulse having a pulse width substantially equal to a second number of clock pulses of the digital clock signal;
   a first driver element operative to receive the first enable pulse and generate in response thereof, a first driver pulse that is operative to drive a current in a first direction through the ferrite load for setting a first magnetic flux; and
   a second driver element operative to receive the second enable pulse and generate in response thereof, a second driver pulse that is operative to drive a current in a second direction, opposite the first direction, through the ferrite load for setting a second magnetic flux,
   wherein a leading edge of the second driver pulse substantially coincides with a trailing edge of the first driver pulse.

2. The ferrite load driver system of claim 1, further comprising a memory in which is stored a look-up table that comprises the first number stored at a first address of the memory and the second number stored at a second address of the memory,
   wherein the digital pulse generator is further operative to generate a superset pulse that is operative to overcome a memory effect of the ferrite load.

3. The ferrite load driver system of claim 2, wherein the digital pulse generator is configured as an open-loop system with respect to the the ferrite load, and
   wherein the system further comprises a temperature sensor for adjusting pulse width according to operating temperature.

4. The ferrite load driver system of claim 1, wherein the first driver element comprises a metal oxide field effect transistor (MOSFET).

5. A field programmable gate array (FPGA), comprising:
   a clock generator configured to generate a digital clock signal; and
   a digital pulse generator comprising a look-up table containing a first clock count, the digital pulse generator operative to generate a first enable pulse having a pulse width substantially equal to the first clock count, the first enable pulse operative to control a first driver element located external to the FPGA, wherein the first driver element is operative to drive a reset current pulse, comprising a falling edge, in a first direction through a ferrite load for setting a first magnetic flux in the ferrite load,
   wherein the look-up table further contains a second clock count,
   wherein the digital pulse generator is further operative to generate a second enable pulse having a pulse width substantially actual to the second clock count, the second enable pulse operative to control a second driver element located external to the FPGA, wherein the second driver element is operative to drive a set current pulse, comprising a rising edge, in a second direction through the ferrite load for setting a second magnetic flux in the ferrite load, and
   wherein the falling edge is substantially coincident in time with the rising edge.

6. The FPGA of claim 5, wherein digital pulse generator further comprises a temperature sensor for adjusting at least one of the first clock count and the second clock count according to operating temperature, and
   wherein the digital pulse generator is further operative to generate a superset pulse,
   whereby the set current pulse and the reset current pulse propagate on a common winding through the ferrite load.

7. A method of driving a ferrite load, the method comprising:
   providing a digital clock signal;
   generating a first pulse having a pulse width substantially equal to a first number of clock cycles of the digital clock signal;
   using the first pulse to drive a reset current pulse, comprising a falling edge, through the ferrite load for setting a first magnetic flux;
   generating a second pulse having a pulse width substantially equal to a second number of clock cycles of the digital clock signal; and
   using the second pulse to drive a set current pulse, comprising a rising edge, through the ferrite load for setting a second magnetic flux,
   wherein the falling edge and the rising edge are substantially coincident in time.

8. The method of claim 7, further comprising generating a superset current pulse.

9. The method of claim 8, wherein the pulse width of the first pulse is substantially equal to the pulse width of the second pulse.

10. A method of calibrating and operating a ferrite load driver system, the method comprising:
providing a digital clock signal;
driving a ferrite load with a first pulse having a pulse width equal to a first number of clock cycles of the digital clock signal;
measuring a first flux change of the ferrite load in response thereof;
determining from the first number of clock cycles and the first flux change, a second number of clock cycles of a second pulse operable to generate a desired flux change in the ferrite load;
applying a reset pulse, comprising a falling edge, to the ferrite load; and
applying, to the ferrite load, a set pulse comprising a leading edge that is substantially coincident with the falling edge.

11. The method of claim 10, wherein the step of determining is carried out by a human operator.

12. The method of claim 10, wherein the step of determining comprises:
using computer code to determine the second number of clock cycles; and
storing the second number in a memory location.

13. The method of claim 12, further comprising:
accessing the memory location to obtain the second number; and
generating the second pulse having a pulse width equal to the second number of clock cycles of the digital clock signal.

14. The method of claim 10, wherein the step of driving is carried out when the ferrite load is at a first temperature.

15. The method of claim 14, further comprising:
driving with the first pulse, the ferrite load when the ferrite load is at a second temperature different than the first temperature;
measuring a second flux change of the ferrite load in response thereof; and
determining from the first number of clock cycles and the second flux change, a third number of clock cycles of a third pulse operable to generate the desired flux change in the ferrite load at the second temperature.

16. The method of claim 15, further comprising:
storing at least one of the first, the second, and the third number of clock cycles.

17. The program of claim 15, further comprising logic configured to produce a superset pulse.

18. A program stored on a computer-readable medium for driving a ferrite load, the program comprising:
logic configured to obtain a first clock count from a first memory location;
logic configured to use the first clock count to generate a first pulse for driving a reset current pulse, comprising a trailing edge, in a first direction through the ferrite load for setting a first magnetic flux
logic configured to obtain a second clock count from a second memory location;
logic configured to use the second clock count to generate a second pulse for driving a set current, comprising a leading edge, in a second direction through the ferrite load for setting a second magnetic flux,
wherein the leading edge is coincident with the trailing edge.

* * * * *